United States Patent
Ravinuthula et al.

(10) Patent No.: US 10,623,013 B1
(45) Date of Patent: Apr. 14, 2020

(54) SYSTEMS WITH PAIRS OF VOLTAGE LEVEL SHIFTER SWITCHES TO COUPLE VOLTAGE LEVEL SHIFTERS TO ANTI-ALIASING FILTERS

(71) Applicant: TEXAS INSTRUMENTS INCORPORATED, Dallas, TX (US)

(72) Inventors: Vishnu Ravinuthula, Allen, TX (US); Kyl Wayne Scott, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/173,883

(22) Filed: Oct. 29, 2018

(51) Int. Cl.
*H03M 1/06* (2006.01)
*H03M 3/00* (2006.01)
*H03K 19/0175* (2006.01)
*G01R 31/36* (2020.01)
*H03H 17/02* (2006.01)
*G01R 31/396* (2019.01)

(52) U.S. Cl.
CPC ........ *H03M 3/344* (2013.01); *G01R 31/3648* (2013.01); *G01R 31/396* (2019.01); *H03H 17/0251* (2013.01); *H03K 19/017509* (2013.01); *H03M 3/458* (2013.01)

(58) Field of Classification Search
CPC ........ H03M 3/344; H03M 3/458; H03M 1/12; H03M 1/00; H03M 1/06; H03M 1/1023; H03M 1/203; H03M 1/207; G01R 31/396; G01R 31/3648; H03K 19/017509; H03H 17/0251

USPC ................................................. 341/118, 155
See application file for complete search history.

(56) References Cited

U.S. PATENT DOCUMENTS

| | | | | |
|---|---|---|---|---|
| 5,408,235 A | * | 4/1995 | Doyle | H03H 17/0251 341/120 |
| 6,833,803 B2 | * | 12/2004 | Mayfield | H03M 1/1019 341/155 |
| 7,098,823 B2 | * | 8/2006 | O'Dowd | H03M 3/34 341/118 |
| 7,215,171 B2 | * | 5/2007 | Kocaman | H03K 5/003 327/307 |
| 9,379,694 B2 | * | 6/2016 | den Besten | H03K 17/005 |
| 9,503,121 B2 | * | 11/2016 | Bach | H03M 3/464 |
| 10,073,812 B2 | * | 9/2018 | Weldon | G06F 17/10 |

* cited by examiner

*Primary Examiner* — Jean B Jeanglaude
(74) *Attorney, Agent, or Firm* — Mark Allen Valetti; Charles A. Brill; Frank D. Cimino

(57) ABSTRACT

A battery powered system includes a voltage level shifter, an anti-aliasing filter, a pair of switches, a unity gain differential buffer, a second pair of switches, and an analog-to-digital converter. The first pair of switches couple the differential output port of the voltage level shifter to the differential input port of the anti-aliasing filter. The second pair of switches couple the differential output port of the anti-aliasing filter to the differential input port of the unity gain differential buffer. The analog-to-digital converter is coupled to the differential output port of the unity gain differential buffer.

20 Claims, 3 Drawing Sheets

SYSTEMS WITH PAIRS OF VOLTAGE LEVEL SHIFTER SWITCHES TO COUPLE VOLTAGE LEVEL SHIFTERS TO ANTI-ALIASING FILTERS

BACKGROUND

In many battery powered applications such as, for example, electric vehicles employing power systems comprising multiple battery cells, circuits are employed to monitor the battery cells, and to read the voltages of the battery cells. The voltages of the battery cells are digitized to provide digital data indicative of the voltages of the battery cells.

SUMMARY

In accordance with at least one example of the disclosure, a system comprises: a first voltage level shifter comprising a differential output port; a first anti-aliasing filter comprising a differential input port and a differential output port; a first pair of voltage level shifter switches to couple the differential output port of the first voltage level shifter to the differential input port of the first anti-aliasing filter; a unity gain differential buffer comprising a differential input port and a differential output port; a first pair of anti-aliasing filter switches to couple the differential output port of the first anti-aliasing filter to the differential input port of the unity gain differential buffer; and an analog-to-digital converter coupled to the differential output port of the unity gain differential buffer.

In accordance with at least one example of the disclosure, a system comprises: a first voltage level shifter comprising a differential input port and a differential output port; a first anti-aliasing filter comprising a differential input port coupled to the differential output port of the first voltage level shifter, and a differential output port; a unity gain differential buffer comprising a differential input port and a differential output port; a first pair of anti-aliasing filter switches to couple the differential output port of the first anti-aliasing filter to the differential input port of the unity gain differential buffer; a first bulk current injection filter comprising a differential output port and a differential input port; and a first pair of bulk current injection filter switches to couple the differential output port of the first bulk current injection filter to the differential input port of the first voltage level shifter; and an analog-to-digital converter coupled to the differential output port of the unity gain differential buffer.

In accordance with at least one example of the disclosure, a system comprises: an analog-to-digital converter; a unity gain differential buffer comprising a differential input port and a differential output port coupled to the analog-to-digital converter; a first anti-aliasing filter comprising a differential input port and a differential output port; a first pair of anti-aliasing filter switches to couple the differential output port of the first anti-aliasing filter to the differential input port of the unity gain differential buffer; a second anti-aliasing filter comprising a differential input port and a differential output port; a second pair of anti-aliasing filter switches to couple the differential output port of the second anti-aliasing filter to the differential input port of the unity gain differential buffer; a first voltage level shifter comprising a differential input port and a differential output port; a first pair of voltage level shifter switches to couple the differential output port of the first voltage level shifter to the differential input port of the first anti-aliasing filter; a second voltage level shifter comprising a differential input port and a differential output port; and a second pair of voltage level shifter switches to couple the differential output port of the second voltage level shifter to the differential input port of the second anti-aliasing filter.

BRIEF DESCRIPTION OF THE DRAWINGS

For a detailed description of various examples, reference will now be made to the accompanying drawings in which.

DETAILED DESCRIPTION

Some conventional circuits for monitoring multiple battery cells and converting their respective voltages into digital data makes use of multiple anti-aliasing filters, with one anti-aliasing filter for each battery cell being monitored. Such circuits have relatively low latency because there is sufficient time for the anti-aliasing filters to charge and for transients to die out before a value is read and digitized for each battery cell. However, such circuits utilize a relatively large area because of the multiple anti-aliasing filters. To reduce circuit die area, some circuits for monitoring battery cells employ for each group of battery cells (e.g., a group may consist of four battery cells) a single anti-aliasing filter, but the resulting circuit configuration makes use of multiplexing in which the latency is reduced because of the settling time needed for the single anti-aliasing filter. Examples described herein utilize two anti-aliasing filters for a group of four battery cells such that when one anti-aliasing filter is being charged, the other is providing its output to an analog-to-digital converter. In this way, examples achieve a relatively low latency and efficient use of die area.

Figure 1:
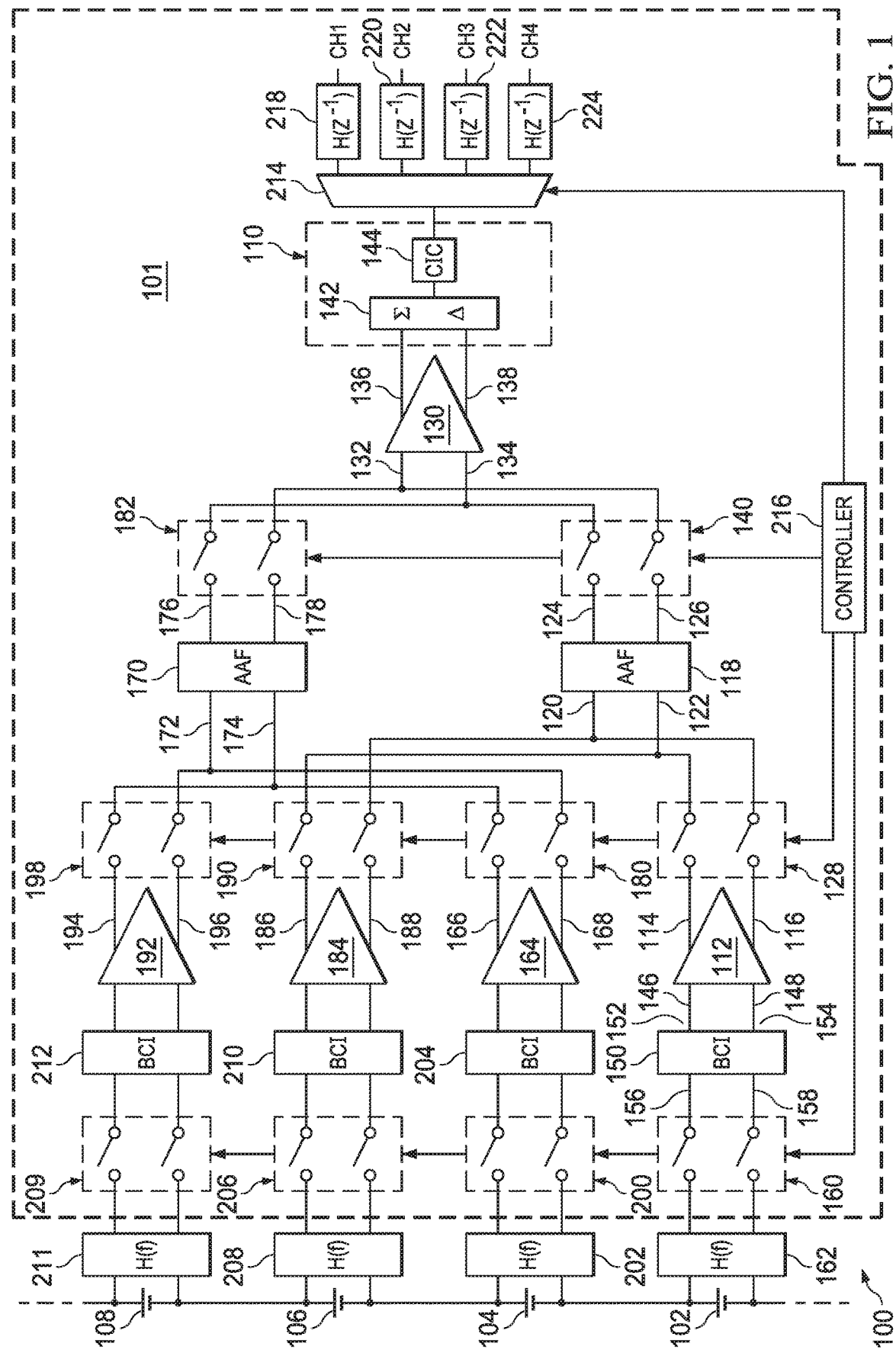
FIG. 1 shows circuitry for monitoring the voltage of multiple battery cells, in accordance with various examples.

FIG. 1 depicts a system 100 to monitor the voltage of multiple battery cells. The system 100 may find use in a variety of applications, including electric vehicle (EV) applications, and more particularly in tandem with battery cells used in EVs. In the example of system 100, four battery cells are shown: a first battery cell 102, a second battery cell 104, a third battery cell 106, and a fourth battery cell 108. In many applications such as, for example, in automotive applications, a battery powered system includes more than four battery cells. The examples described herein are applicable to battery powered systems having more than four battery cells.

Four channels, labeled CH1, CH2, CH3, and CH4 in FIG. 1, each provide digital information indicative of the voltage of their respective battery cells. The channels CH1, CH2, CH3, and CH4 provide, respectively, digital information indicative of the voltage of the first battery cell 102, the second battery cell 104, the third battery cell 106, and the fourth battery cell 108. An analog-to-digital converter 110 and circuit modules, to be described below, provide filtering and sampling functions for generating the digital information on the channels CH1, CH2, CH3, and CH4 indicative of the voltages on the battery cells 102, 104, 106, and 108.

A first voltage level shifter 112 comprises a differential output port, labeled 114 and 116, and a differential input port, labeled 146 and 148. A first anti-aliasing filter 118 comprises a differential input port, labeled 120 and 122, and a differential output port, labeled 124 and 126. A first pair of voltage level shifter switches 128 couples the differential output port 124 and 126 of the first voltage level shifter 112 to the differential input port 120 and 122 of the first anti-aliasing filter 118. A unity gain differential buffer 130 comprises a differential input port, labeled 132 and 134, and a differential output port, labeled 136 and 138. A first pair of anti-aliasing filter switches 140 couples the differential output port 124 and 126 of the first anti-aliasing filter 118 to the differential input port 132 and 134 of the unity gain differential buffer 130. The analog-to-digital converter 110 is coupled to the differential output port 136 and 138 of the unity gain differential buffer 130.

In the example of FIG. 1, the analog-to-digital converter 110 comprises a sigma-delta modulator 142 coupled to the differential output port 136 and 138 of the unity gain differential buffer 130, and a cascaded integrator comb filter 144 coupled to the sigma-delta modulator 142. Other examples can utilize different types of analog-to-digital conversion.

The system 100 further comprises a first bulk current injection filter 150 comprising a differential output port, labeled 152 and 154, coupled to the differential input port 146 and 148 of the first voltage level shifter 112. The first bulk current injection filter 150 further comprises a differential input port, labeled 156 and 158. The first battery cell 102 is coupled to the differential input port 156 and 158 of the first bulk current injection filter 150. A first pair of battery switches 160 couples the first battery cell 102 to the first current injection filter 150. In the example of FIG. 1, the first battery cell 102 is further coupled to the first current injection filter 150 by way of a first common-mode noise filter 162.

The system 100 further comprises: a second voltage level shifter 164 comprising a differential output port, labeled 166 and 168; a second anti-aliasing filter 170 comprising a differential input port, labeled 172 and 174, and a differential output port, labeled 176 and 178; a second pair of voltage level shifter switches 180 to couple the differential output port 166 and 168 of the second voltage level shifter 164 to the differential input port 172 and 174 of the second anti-aliasing filter 170; and a second pair of anti-aliasing filter switches 182 to couple the differential output port 176 and 178 of the second anti-aliasing filter 170 to the differential input port 132 and 134 of the unity gain differential buffer 130.

The system 100 further comprises: a third voltage level shifter 184 comprising a differential output port, labeled 186 and 188; a third pair of voltage level shifter switches 190 to couple the differential output port 186 and 188 of the third voltage level shifter 184 to the differential input port 120 and 122 of the first anti-aliasing filter 118; a fourth voltage level shifter 192 comprising a differential output port, labeled 194 and 196; and a fourth pair of voltage level shifter switches 198 to couple the differential output port 194 and 196 of the fourth voltage level shifter 192 to the differential input port 172 and 174 of the second anti-aliasing filter 170.

The system 100 further comprises: a second pair of battery switches 200 to couple the second battery cell 104 to the second voltage level shifter 164, the second battery cell 104 coupled to the second voltage level shifter 164 by way of a common-mode noise filter 202 and a bulk current injection filter 204; a third pair of battery switches 206 to couple the third battery cell 106 to the third voltage level shifter 184, the third battery cell 106 coupled to the third voltage level shifter 184 by way of a common-mode noise filter 208 and a bulk current injection filter 210; and a fourth pair of battery switches 209 to couple the fourth battery cell 108 to the fourth voltage level shifter 192, the fourth battery cell 108 coupled to the fourth voltage level shifter 192 by way of a common-mode noise filter 211 and a bulk current injection filter 212.

The system 100 further comprises a demultiplexer 214. The demultiplexer 214, depending upon its state, provides the output of the analog-to-digital converter 110 to one of the channels CH1, CH2, CH3, or CH 4. Additional filtering can be performed on the data provided on the channels CH1, CH2, CH3, or CH 4, for example by digital filters 218, 220, 222, and 224.

The system 100 further comprises a controller 216. The controller 216 is a finite state machine, where its functionality can be realized by hardware only, by hardware and firmware, by hardware and software, or a combination thereof. When the battery cells are to be monitored, the controller 216 closes the pairs of battery switches (160, 200, 206, 209) to connect the battery cells to the various circuit modules. The controller 216 sequences the states of the voltage level shifter switches (128, 180, 190, 198), the anti-aliasing filter switches (140, 182), and the demultiplexer 214 so that data on each channel corresponds to its corresponding battery cell, where CH1 monitors the first battery cell 102, CH2 monitors the second battery cell 104, and so forth.

The controller 216 controls the states of the voltage level shifter switches (128, 180, 190, 198) and the anti-aliasing filter switches (140, 182) so that when one of the anti-aliasing filters is being read by the analog-to-digital converter 110, the other anti-aliasing filter is being charged. This reduces latency in monitoring the battery cells while utilizing only two anti-aliasing filters to reduce die area. As will be described in more detail below, the controller 216 is configured to: switch on and off the first and second pairs of voltage level shifter switches (e.g., 128 and 180); and switch on and off the first and second pairs of anti-aliasing filter switches (e.g., 140 and 182).

More particularly, the controller 216 is configured to switch on and off various combinations of the voltage level shifter switches, as follows. The controller 216 switches on and off the first and third pairs of voltage level shifter switches (128 and 190) in complementary fashion. By complementary fashion, it is meant that the first pair of voltage level shifter switches 128 is switched on when the third pair of voltage level shifter switches 190 is switched off, and the third pair of voltage level shifter switches 190 is switched on when the first pair of voltage level shifter switches 128 is switched off. The controller 216 further switches on and off the second and fourth pairs of voltage level shifter switches (180 and 198) in complementary fashion. Furthermore, the controller 216 switches on and off the first and second pairs of anti-aliasing filter switches (118 and 170) in complementary fashion. This complementary switching of the first and second pairs of anti-aliasing filter switches (118 and 170) results in charging the second anti-aliasing filter 170 when the first anti-aliasing filter 118 is coupled to the differential input port 132 and 134 of the unity gain differential buffer 130, and charging the first anti-aliasing filter 118 when the second anti-aliasing filter 170 is coupled to the differential input port 132 and 134 of the unity gain differential buffer 130.

The above way in which the controller 216 controls the various switches can be described in more detail by the following example, where the controller 216 includes a two-bit counter to sequentially sequence through the two-bit counter's four states, and where the controller 216 evaluates a set of Boolean functions in response to each of the four states in order to set the states of the various switches and the demultiplexer 214. Based upon the evaluation of the set of Boolean functions in response to the two-bit counter, the controller 216 sequences the states of the voltage level shifter switches (128, 180, 190, 198), the anti-aliasing filter switches (140, 182), and the demultiplexer 214. The sequencing of states and the set of Boolean functions are described as follows.

Let the ordered Boolean pair $(S_1, S_0)$ represent the four states of the two-bit counter, with $S_1$ and $S_0$ given by: (0,0), (0,1), (1,0), and (1,1). The controller 216 generates a gray code based upon the Boolean pair $(S_1, S_0)$, where the controller 216 uses the gray code to generate inputs to the set of Boolean functions. The controller 216 generates the gray code based on the two-bit counter by the following mapping $(S_1, S_0) \rightarrow (G_1, G_0)$: (0,0)→(0,0), (0,1)→(0,1), (1,0)→(1,1), and (1,1)→(1,0).

The set of Boolean functions can be described as follows, where "-" denotes a Boolean complement, a product denotes a logical AND, a sum denotes a logical OR, and where a Boolean function evaluated to a Boolean "1" denotes that its corresponding switch is on and when evaluated to a Boolean "0" denotes that its corresponding switch is off:

$G_1 G_0 + (-G_1)(-G_0)$ for the state of the first anti-aliasing filter switch 140;

$(-G_1) G_0 + (G_1)(-G_0)$ for the state of the second anti-aliasing filter switch 182;

$-G_0$ for the state of the first pair of voltage level shifter switches 128;

$-G_1$ for the state of the second pair of voltage level shifter switches 180;

$G_0$ for the state of the third pair of voltage level shifter switches 190;

$G_1$ for the state of the fourth pair of voltage level shifter switches 198; and $(G_1, G_0)$ for the state of the demultiplexer 214.

As a specific instance of the above example, suppose the two-bit counter state is (1, 1). The controller 216 maps this two-bit counter state to the Gray code (1, 0), where $G_1=1$ and $G_0=0$. For the first anti-aliasing filter switch 140, the controller 216 evaluates the Boolean function $G_1 G_0 + (-G_1)(-G_0)$ to set its state. For this specific instance, the controller 216 evaluates this Boolean function to 0, indicating that the first anti-aliasing filter switch 140 is off (open). The controller 216 sets the states of the other switches and the demultiplexer 214 as provided by the Boolean functions described above.

Some or all of the components illustrated in FIG. 1 can be integrated on one or more die. For example, a dashed rectangle labeled 101 in FIG. 1 denotes an example of the components that can be integrated on a single die.

The common-mode noise filters 162, 202, 208, and 211 filter out common-mode noise when measuring the battery cells 102, 104, 106, and 108. The common-mode filters can be implemented as passive filters, as described with respect to FIG. 2 below. The bulk current injection filters 150, 204, 210, and 212 reduce the effects of common-mode and differential-mode currents causing unintentional reception and radiation of electromagnetic radiation. The bulk current injection filters can be implemented as passive filters, as described with respect to FIG. 2 below. The voltage level shifters 112, 164, 184, and 192 level shift their respective input voltages to a lower voltage so that circuit components coupled to their respective output are in a lower voltage domain. The voltage level shifters can be implemented with passive and active components, as described with respect to FIG. 2 below. The anti-aliasing filters 118 and 170 filter their respective inputs to mitigate aliasing that might arise due to the analog-to-digital converter 110 sampling their respective outputs. The unity gain differential buffer 130 buffers the output of the anti-aliasing filters 118 and 170.

Figure 2:
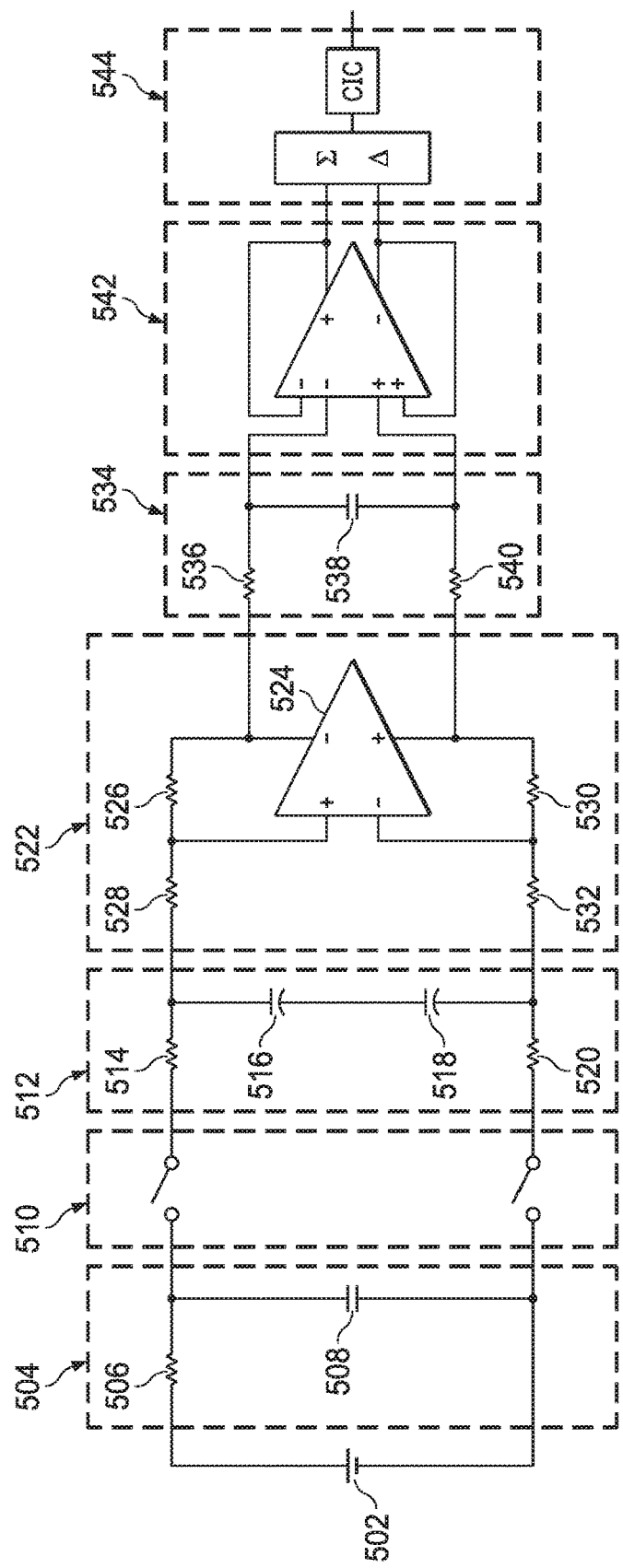
FIG. 2 shows circuitry usable to monitor the voltage of multiple battery cells, in accordance with various examples.

FIG. 2 shows particular examples of some of the circuit modules shown in FIG. 1. These examples may find use in a variety of applications, including EV applications, and more particularly in tandem with battery cells used in EVs. A battery 502 is coupled to a common-mode noise filter 504, the common-mode noise filter 504 comprising an inductor 506 and a capacitor 508. The common-mode noise filter 504 is an example of any one of the common-mode noise filters 162, 202, 208, and 211. A pair of switches 510 couples the common-mode noise filter 504 to a bulk current injection filter 512. The bulk current injection filter 512 comprises a resistor 514 coupled to a capacitor 516, and a resistor 520 coupled to a capacitor 518, where the capacitor 516 is coupled to the capacitor 518. The bulk current injection filter 512 is an example of any one of the bulk current injection filters 150, 204, 210, and 212. A voltage level shifter 522 is coupled to the bulk current injection filter 512. The voltage level shifter 522 comprises an operational amplifier 524 with a first output port and a first input port coupled to resistors 526 and 528, and a second output port and a second input port coupled to resistors 530 and 532. The voltage level shifter 522 is an example of any one of the voltage level shifters 112, 164, 184, and 192. An anti-aliasing filter 534 is coupled to the voltage level shifter 522. The anti-aliasing filter 534 comprises a resistor 536 coupled to a capacitor 538, and a resistor 540 coupled to the capacitor 538. The anti-aliasing filter 534 is an example of any one of the anti-aliasing filers 118 and 170. As described with respect to the example of FIG. 1, a unity gain differential buffer 542 is coupled to the anti-aliasing filter 534, and an analog-to-digital converter 544 is coupled to the unity gain differential buffer 542. The unity gain differential buffer 542 is an example of the unity gain differential buffer 130.

Figure 3:
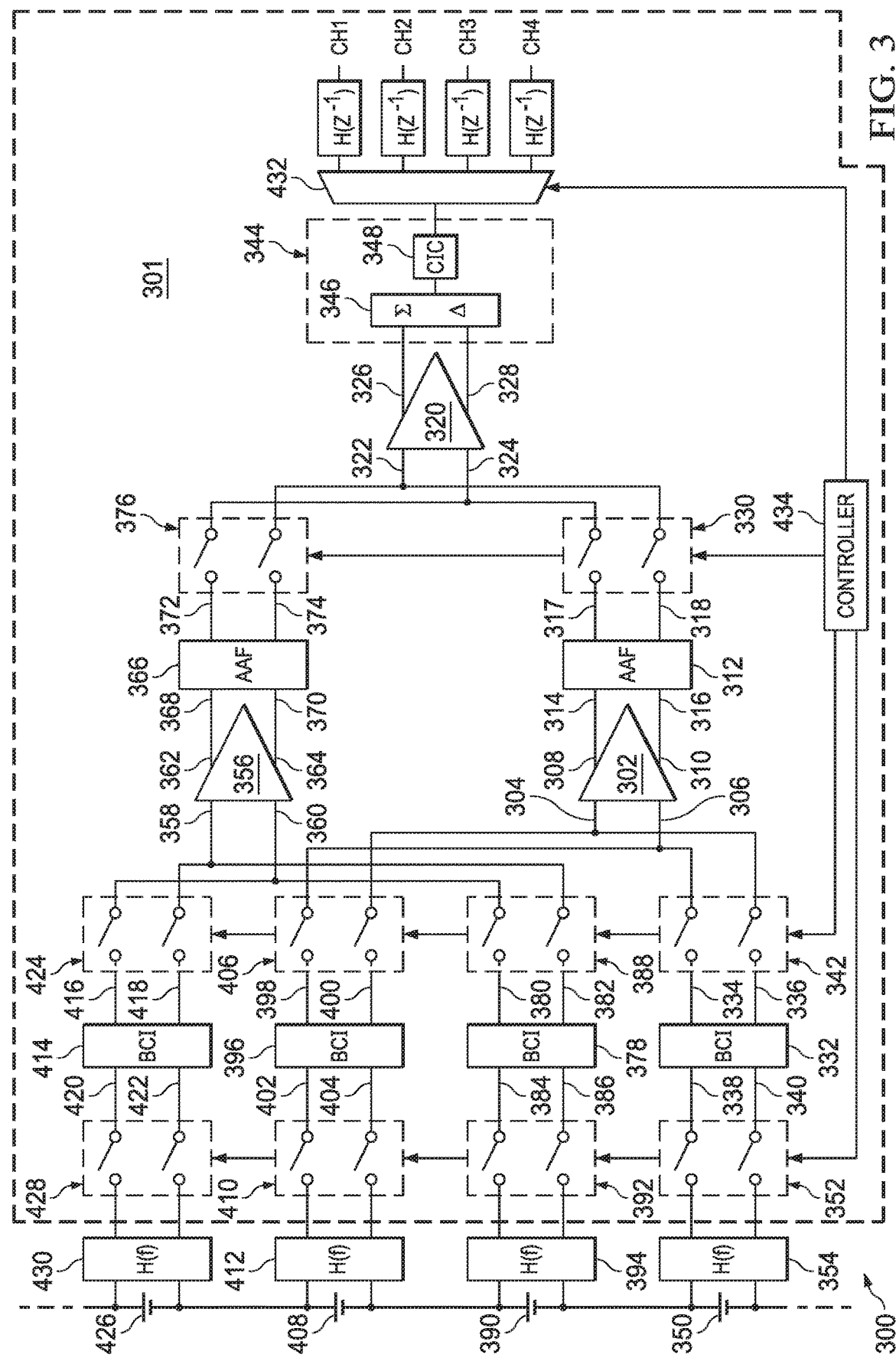
FIG. 3 shows circuitry for monitoring the voltage of multiple battery cells, in accordance with various examples.

FIG. 3 depicts a system 300 to monitor the voltage of several battery cells. The system 300 comprises: a first voltage level shifter 302 comprising a differential input port, labeled 304 and 306, and a differential output port, labeled 308 and 310; and a first anti-aliasing filter 312 comprising a differential input port, labeled 314 and 316, coupled to the differential output port 308 and 310 of the first voltage level shifter 302, and a differential output port, labeled 317 and 318; a unity gain differential buffer 320 comprising a differential input port, labeled 322 and 324, and a differential output port, labeled 326 and 328; a first pair of anti-aliasing filter switches 330 to couple the differential output port 317 and 318 of the first anti-aliasing filter 312 to the differential input port 322 and 324 of the unity gain differential buffer 320. The system 300 further comprises: a first bulk current injection filter 332 comprising a differential output port, labeled 334 and 336, and a differential input port, labeled 338 and 340; a first pair of bulk current injection filter switches 342 to couple the differential output port 334 and 336 of the first bulk current injection filter 332 to the differential input port 304 and 306 of the first voltage level shifter 302; and an analog-to-digital converter 344 coupled to the differential output port 326 and 328 of the unity gain differential buffer 320. In the example of system 300, the analog-to-digital converter comprises: a sigma-delta modulator 346 coupled to the differential output port 326 and 328 of the unity gain differential buffer 320; and a cascaded integrator comb filter 348 coupled to the sigma-delta modulator 346.

The system 300 further comprises a first battery cell 350 coupled to the differential input port 338 and 340 of the first bulk current injection filter 332. The system 300 further comprises a first pair of battery switches 352 to couple the first battery cell 350 to the differential input port 338 and 340 of the first bulk current injection filter 332. In the example of system 300, a first common-mode noise filter 354 couples the first battery cell 350 to the first pair of battery switches 352.

The system 300 further comprises: a second voltage level shifter 356 comprising a differential input port, labeled 358 and 360, and a differential output port, labeled 362 and 364; a second anti-aliasing filter 366 comprising a differential input port, labeled 368 and 370, coupled to the differential output port 362 and 364 of the second voltage level shifter 356, and a differential output port, labeled 372 and 374; and a second pair of anti-aliasing filter switches 376 to couple the differential output port 372 and 374 of the second anti-aliasing filter 366 to the differential input port 322 and 324 of the unity gain differential buffer 320.

The system 300 further comprises: a second bulk current injection filter 378 comprising a differential output port, labeled 380 and 382, and a differential input port, labeled 384 and 386; and a second pair of bulk current injection filter switches 388 to couple the differential output port 380 and 382 of the second bulk current injection filter 378 to the differential input port 358 and 360 of the second voltage level shifter 356. The system 300 further comprises a second battery cell 390 coupled to the differential input port 384 and 386 of the second bulk current injection filter 378; a second pair of battery switches 392 to couple the second battery cell 390 to the differential input port 384 and 386 of the second bulk current injection filter 378. In the example of system 300, a second common-mode noise filter 394 couples the second battery cell 390 to the second pair of battery switches 392.

The system 300 further comprises: a third bulk current injection filter 396 comprising a differential output port, labeled 398 and 400, and a differential input port, labeled 402 and 404; a third pair of bulk current injection filter switches 406 to couple the differential output port 398 and 400 of the third bulk current injection filter 396 to the differential input port 304 and 306 of the first voltage level shifter 302. The system 300 further comprises a third battery cell 408 coupled to the differential input port 402 and 404 of the third bulk current injection filter 396; a third pair of battery switches 410 to couple the third battery cell 408 to the differential input port 402 and 404 of the third bulk current injection filter 396. In the example of system 300, a third common-mode noise filter 412 couples the third battery cell 408 to the third pair of battery switches 410.

The system 300 further comprises: a fourth bulk current injection filter 414 comprising a differential output port, labeled 416 and 418, and a differential input port, labeled 420 and 422; and a fourth pair of bulk current injection filter switches 424 to couple the differential output port 416 and 418 of the fourth bulk current injection filter 414 to the differential input port 358 and 360 of the second voltage level shifter 356. The system 300 further comprises a fourth battery cell 426 coupled to the differential input port 420 and 422 of the fourth bulk current injection filter 414; a fourth pair of battery switches 428 to couple the fourth battery cell 426 to the differential input port 420 and 422 of the fourth bulk current injection filter 414. In the example of system 300, a fourth common-mode noise filter 430 couples the fourth battery cell 426 to the fourth pair of battery switches 428. The system 300 shows four battery cells, but examples can include more than four battery cells.

The system 300 further comprises a demultiplexer 432. The demultiplexer 432, depending upon its state, provides the output of the analog-to-digital converter 344 to one of the channels CH1, CH2, CH3, or CH 4. Additional filtering may be performed on the data provided on the channels CH1, CH2, CH3, or CH 4.

The system 300 further comprises a controller 434. The controller 434 is a finite state machine, where its functionality can be realized by hardware only, by hardware and firmware, by hardware and software, or a combination thereof. When the battery cells are to be monitored, the controller 434 closes the pairs of battery switches (352, 392, 410, 428) to connect the battery cells to the various circuit modules. The controller 434 sequences the states of the bulk current injection filter switches (342, 388, 406, 424), the anti-aliasing filter switches (330, 376), and the demultiplexer 432 so that data on each channel corresponds to its corresponding battery cell, where CH1 monitors the first battery cell 350, CH2 monitors the second battery cell 390, and so forth.

The controller 434 controls the states of the bulk current injection filter switches (342, 388, 406, 424), and the anti-aliasing filter switches (330, 376) so that when one of the anti-aliasing filters is being read by the analog-to-digital converter 344, the other anti-aliasing filter is being charged. This reduces latency in monitoring the battery cells while utilizing only two anti-aliasing filters to reduce die area.

The controller 434 is configured to: switch on and off the first and second pairs of bulk current injection filter switches 342 and 388; and switch on and off the first and second pairs of anti-aliasing filter switches 330 and 376. More particularly, the controller is configured to: switch on and off the first and third pairs of bulk current injection filter switches 342 and 406 in complementary fashion; switch on and off the second and fourth pairs of bulk current injection filter switches 388 and 424 in complementary fashion; and switch on and off the first and second pairs of anti-aliasing filter switches 330 and 376 in complementary fashion.

The above way in which the controller 434 controls the various switches can be described in more detail by the following example, where the controller 434 includes a two-bit counter to sequentially sequence through the two-bit counter's four states, and where the controller 434 evaluates a set of Boolean functions in response to each of the four states in order to set the states of the various switches and the demultiplexer 432. Based upon the evaluation of the set of Boolean functions in response to the two-bit counter, the controller 434 sequences the states of the bulk current injection filter switches (342, 388, 406, 424), the anti-aliasing filter switches (330, 376), and the demultiplexer 432. The sequencing of the states and the set of Boolean functions are described as follows.

Let the ordered Boolean pair $(S_1,S_0)$ representing the four states of the two-it counter, with $S_1$ and $S_0$ given by: (0,0), (0,1), (1,0), and (1,1). The controller 434 generates a gray code based upon the Boolean pair $(S_1,S_0)$, where controller 434 uses the gray code to generate inputs to the set of Boolean functions. The controller 434 generates the gray code based on the two-bit counter by the following mapping $(S_1,S_0) \rightarrow (G_1,G_0)$: $(0,0) \rightarrow (0,0)$, $(0,1) \rightarrow (0,1)$, $(1,0) \rightarrow (1,1)$, and $(1,1) \rightarrow (1,0)$.

The set of Boolean functions can be described as follows, where "−" denotes a Boolean complement, a product denotes a logical AND, a sum denotes a logical OR, and where a Boolean function evaluated to a Boolean "1" denotes that its corresponding switch is on and when evaluated to a Boolean "0" denotes that its corresponding switch is off: $G_1G_0 + (-G_1)(-G_0)$ for the state of the first anti-aliasing filter switch 330; $(-G_1)G_0 + (G_1)(-G_0)$ for the state of the second anti-aliasing filter switch 376; $-G_0$ for the state of the first pair of bulk current injection filter switches 342; $-G_1$ for the state of the second pair of bulk current injection filter switches 388; $G_0$ for the state of the third pair of bulk current injection filter switches 406; $G_1$ for the state of the fourth pair of bulk current injection filter switches 424; and $(G_1,G_0)$ for the state of the demultiplexer 432.

As a specific instance of the above example, suppose the two-bit counter state is (1, 1). The controller 434 maps this two-bit counter state to the Gray code (1, 0), where $G_1=1$ and $G_0=0$. For the first anti-aliasing filter switch 330, the controller 434 evaluates the Boolean function $G_1G_0 + (-G_1)(-G_0)$ to set its state. For this specific instance, the controller 434 evaluates this Boolean function to 0, indicating that the first anti-aliasing filter switch 330 is off (open). The controller 434 sets the states of the other switches and the demultiplexer 432 as provided by the Boolean functions described above.

Some or all the components illustrated in FIG. 3 can be integrated on one or more die. For example, a dashed rectangle labeled 301 in FIG. 1 denotes an example of the components that can be integrated on a single die. The common-mode noise filters (354, 394, 412, 430), the bulk current injection filters (332, 378, 396, 414), the voltage level shifters (302, 356), the anti-aliasing filters (312, 366), the unity gain differential buffer 320, and the analog-to-digital converter 344 of the example illustrated in FIG. 3 can have the same structures as their corresponding counterparts in FIG. 1 as illustrated in FIG. 2.

For every grouping of four battery cells, the example of FIG. 1 utilizes four voltage level shifters, with each voltage level shifter followed by a pair of voltage level shifter switches. For every grouping of four battery cells, the example of FIG. 3 utilizes two voltage level shifters coupled directly to their respective anti-aliasing filters. However, the pairs of bulk current injection switches in the example of FIG. 3 are in a relatively high voltage domain because they are configured in the system 300 at the input side of the voltage level shifters, whereas the pairs of voltage level shifter switches in the example of FIG. 1 are configured in the system at the output side of the voltage level shifters.

Some example circuits may include more than two bulk current injection filters coupled to a particular anti-aliasing filter. For example, in the example of FIG. 1, the bulk current injection filters 150 and 210 can each, in turn, be coupled to the anti-aliasing filter 118. However, in some example circuits more than two bulk current injection filters are configurable to be coupled to an anti-aliasing filter at any particular instant of time. Furthermore, some example circuits may include more than two anti-aliasing filters. For example, for an example circuit having three anti-aliasing filters, one of the three anti-aliasing filters may be in the process of being read while the other two anti-aliasing filters are being charged.

Figure 4:
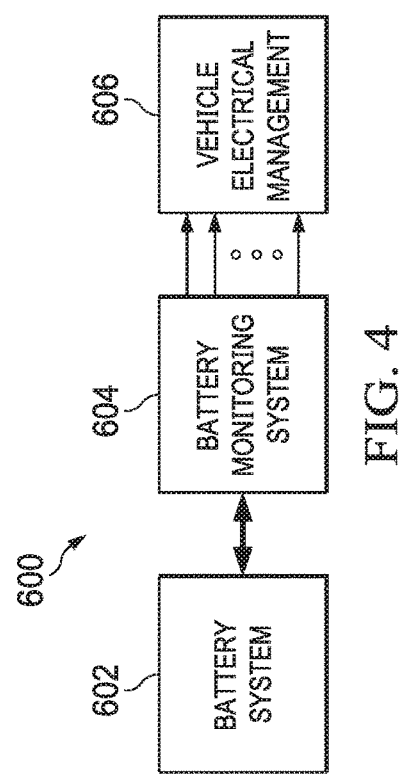
FIG. 4 shows a system for monitoring the voltage of multiple battery cells, in accordance with various examples.

Example circuits can be used in a wide variety of applications for monitoring multi-cell battery systems, such as, for example, automotive applications. FIG. 4 shows a system 600 in which example circuits can find application, where the system 600 is part of an automobile or vehicle.

The system 600 includes a battery system 602 comprising multiple cells. The battery system 602 can be used as the main electrical power source in a hybrid or all-electric vehicle. In other applications, vehicle electrical systems are expected to be operated at voltages higher than the traditional 12V systems, so that in such applications the battery system 602 can include a relatively large number of cells. A battery monitoring system 604 comprises example circuits, such as that of FIG. 1 and FIG. 3, to monitor the voltages of the cells within the battery system 602. The monitored voltages for each cell in the battery system 602 are provided to a vehicle electrical management system 606. The vehicle electrical management system 606 can be part of a vehicle control system for monitoring the status of the many components and system used in automotive vehicles.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
   a first voltage level shifter comprising a differential output port;
   a first anti-aliasing filter comprising a differential input port and a differential output port;
   a first pair of voltage level shifter switches to couple the differential output port of the first voltage level shifter to the differential input port of the first anti-aliasing filter;
   a unity gain differential buffer comprising a differential input port and a differential output port;
   a first pair of anti-aliasing filter switches to couple the differential output port of the first anti-aliasing filter to the differential input port of the unity gain differential buffer; and an analog-to-digital converter coupled to the differential output port of the unity gain differential buffer.

2. The system of claim 1, the analog-to-digital converter comprising:
a sigma-delta modulator coupled to the differential output port of the unity gain differential buffer; and
a cascaded integrator comb filter coupled to the sigma-delta modulator.

3. The system of claim 1, the first voltage level shifter comprising a differential input port, the system further comprising:
a first bulk current injection filter comprising a differential output port coupled to the differential input port of the first voltage level shifter.

4. The system of claim 3, the first bulk current injection filter comprising a differential input port, the system further comprising:
a first battery cell coupled to the differential input port of the first bulk current injection filter.

5. The system of claim 1, further comprising:
a second voltage level shifter comprising a differential output port;
a second anti-aliasing filter comprising a differential input port and a differential output port;
a second pair of voltage level shifter switches to couple the differential output port of the second voltage level shifter to the differential input port of the second anti-aliasing filter; and
a second pair of anti-aliasing filter switches to couple the differential output port of the second anti-aliasing filter to the differential input port of the unity gain differential buffer.

6. The system of claim 5, further comprising a controller, the controller to:
switch on and off the first and second pairs of voltage level shifter switches; and
switch on and off the first and second pairs of anti-aliasing filter switches.

7. The system of claim 5, further comprising:
a third voltage level shifter comprising a differential output port;
a third pair of voltage level shifter switches to couple the differential output port of the third voltage level shifter to the differential input port of the first anti-aliasing filter;
a fourth voltage level shifter comprising a differential output port; and
a fourth pair of voltage level shifter switches to couple the differential output port of the fourth voltage level shifter to the differential input port of the second anti-aliasing filter.

8. The system of claim 7, further comprising a controller, the controller to:
switch on and off the first and third pairs of voltage level shifter switches in complementary fashion;
switch on and off the second and fourth pairs of voltage level shifter switches in complementary fashion; and
switch on and off the first and second pairs of anti-aliasing filter switches in complementary fashion to charge the second anti-aliasing filter when coupling the first anti-aliasing filter to the differential input port of the unity gain differential buffer, and to charge the first anti-aliasing filter when coupling the second anti-aliasing filter to the differential input port of the unity gain differential buffer.

9. The system of claim 8, further comprising:
a first battery cell coupled to the first voltage level shifter;
a second battery cell coupled to the second voltage level shifter;
a third battery cell coupled to the third voltage level shifter; and
a fourth battery cell coupled to the fourth voltage level shifter.

10. A system comprising:
a first voltage level shifter comprising a differential input port and a differential output port;
a first anti-aliasing filter comprising a differential input port coupled to the differential output port of the first voltage level shifter, and a differential output port;
a unity gain differential buffer comprising a differential input port and a differential output port;
a first pair of anti-aliasing filter switches to couple the differential output port of the first anti-aliasing filter to the differential input port of the unity gain differential buffer;
a first bulk current injection filter comprising a differential output port and a differential input port; and
a first pair of bulk current injection filter switches to couple the differential output port of the first bulk current injection filter to the differential input port of the first voltage level shifter; and
an analog-to-digital converter coupled to the differential output port of the unity gain differential buffer.

11. The system of claim 10, the analog-to-digital converter comprising:
a sigma-delta modulator coupled to the differential output port of the unity gain differential buffer; and
a cascaded integrator comb filter coupled to the sigma-delta modulator.

12. The system of claim 11, the system further comprising:
a first battery cell coupled to the differential input port of the first bulk current injection filter.

13. The system of claim 12, the system further comprising:
a first pair of battery switches to couple the first battery cell to the differential input port of the first bulk current injection filter.

14. The system of claim 10, further comprising:
a second voltage level shifter comprising a differential input port and a differential output port;
a second anti-aliasing filter comprising a differential input port coupled to the differential output port of the second voltage level shifter, and a differential output port; and
a second pair of anti-aliasing filter switches to couple the differential output port of the second anti-aliasing filter to the differential input port of the unity gain differential buffer.

15. The system of claim 10, further comprising:
a second bulk current injection filter comprising a differential output port and a differential input port; and
a second pair of bulk current injection filter switches to couple the differential output port of the second bulk current injection filter to the differential input port of the second voltage level shifter.

16. The system of claim 15, further comprising a controller, the controller to:
switch on and off the first and second pairs of bulk current injection filter switches; and
switch on and off the first and second pairs of anti-aliasing filter switches.

17. The system of claim 15, further comprising:
a third bulk current injection filter comprising a differential output port and a differential input port;
a third pair of bulk current injection filter switches to couple the differential output port of the third bulk current injection filter to the differential input port of the first voltage level shifter;
a fourth bulk current injection filter comprising a differential output port and a differential input port; and
a fourth pair of bulk current injection filter switches to couple the differential output port of the fourth bulk current injection filter to the differential input port of the second voltage level shifter.

18. The system of claim 17, further comprising a controller, the controller to:
switch on and off the first and third pairs of bulk current injection filter switches in complementary fashion;
switch on and off the second and fourth pairs of bulk current injection filter switches in complementary fashion; and
switch on and off the first and second pairs of anti-aliasing filter switches in complementary fashion.

19. A system comprising:
an analog-to-digital converter;
a unity gain differential buffer comprising a differential input port and a differential output port coupled to the analog-to-digital converter;
a first anti-aliasing filter comprising a differential input port and a differential output port;
a first pair of anti-aliasing filter switches to couple the differential output port of the first anti-aliasing filter to the differential input port of the unity gain differential buffer;
a second anti-aliasing filter comprising a differential input port and a differential output port;
a second pair of anti-aliasing filter switches to couple the differential output port of the second anti-aliasing filter to the differential input port of the unity gain differential buffer;
a first voltage level shifter comprising a differential input port and a differential output port;
a first pair of voltage level shifter switches to couple the differential output port of the first voltage level shifter to the differential input port of the first anti-aliasing filter;
a second voltage level shifter comprising a differential input port and a differential output port; and
a second pair of voltage level shifter switches to couple the differential output port of the second voltage level shifter to the differential input port of the second anti-aliasing filter.

20. The system of claim 19, further comprising:
a third voltage level shifter comprising a differential input port and a differential output port;
a third pair of voltage level shifter switches to couple the differential output port of the third voltage level shifter to the differential input port of the first anti-aliasing filter;
a fourth voltage level shifter comprising a differential input port and a differential output port; and
a fourth pair of voltage level shifter switches to couple the differential output port of the fourth voltage level shifter to the differential input port of the second anti-aliasing filter.

* * * * *